(12) United States Patent
Matsumura

(10) Patent No.: US 8,920,056 B2
(45) Date of Patent: Dec. 30, 2014

(54) ELECTRONIC EQUIPMENT

(71) Applicant: Toshiba Tec Kabushiki Kaisha, Shinagawa-ku, Tokyo (JP)

(72) Inventor: Kazuyuki Matsumura, Shizuoka-ken (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/780,183

(22) Filed: Feb. 28, 2013

(65) Prior Publication Data

US 2013/0241375 A1    Sep. 19, 2013

(30) Foreign Application Priority Data

Feb. 28, 2012   (JP) .................................. 2012-042040

(51) Int. Cl.
*B41J 29/12*    (2006.01)
*H05K 5/03*    (2006.01)

(52) U.S. Cl.
CPC ........................................ *H05K 5/03* (2013.01)
USPC ........................................ 400/693; 400/691

(58) Field of Classification Search
CPC ....................................................... H05K 5/03
USPC ....................................................... 400/693
See application file for complete search history.

(56) References Cited

U.S. PATENT DOCUMENTS

| 4,456,315 | A  | * | 6/1984 | Markley et al. ................ 312/137 |
| 6,512,178 | B2 | * | 1/2003 | Goodman ......................... 174/66 |
| 6,582,139 | B2 | * | 6/2003 | Abe et al. ................... 400/599.1 |
| 6,857,541 | B1 | * | 2/2005 | Crisp, III ....................... 222/399 |
| 6,950,302 | B2 | * | 9/2005 | Hubbard .................... 361/679.55 |
| 6,989,986 | B2 | * | 1/2006 | Kumagai et al. .......... 361/679.27 |
| 2011/0255218 | A1 | * | 10/2011 | Pakula et al. ............. 361/679.01 |
| 2011/0255229 | A1 | * | 10/2011 | Murakata .................. 361/679.01 |

FOREIGN PATENT DOCUMENTS

| JP |   60-83286 | 6/1985 |
| JP |   07-121085 | 5/1995 |
| JP |    7-39097 | 7/1995 |
| JP | 2006-150870 | 6/2006 |
| JP | 2011-240648 | 12/2011 |

OTHER PUBLICATIONS

Office Action for Japanese Patent Application No. 2012-042040 Dated Dec. 5, 2013, 8 pages.

* cited by examiner

*Primary Examiner* — Anthony Nguyen
(74) *Attorney, Agent, or Firm* — Amin, Turocy & Watson, LLP

(57) ABSTRACT

An electronic equipment of the embodiment comprises a housing that has an attaching wall with an inclined surface on which a covered object is arranged, an attaching body that has a covering surface covering the covered object and is amounted on the attaching wall, a first convex portion, wherein the projection tip portion of the first convex portion contacts the covering surface, and a second convex portion, wherein the projection tip portion of the second convex portion contacts the inclined surface.

5 Claims, 9 Drawing Sheets

ELECTRONIC EQUIPMENT

CROSS-REFERENCE TO RELATED APPLICATION

This application is based upon and claims the benefit of priority from Japanese Patent Application No. 2012-042040, filed Feb. 28, 2012, the entire contents of which are incorporated herein by reference.

FIELD

Embodiments described herein relate to an electronic equipment.

BACKGROUND

Conventionally, for example, there is a printer that is installed and used in a convenience store. In such a printer, it is desired that liquid such as water is prevented to intrude into the inside thereof.

DETAILED DESCRIPTION

Figure 1:
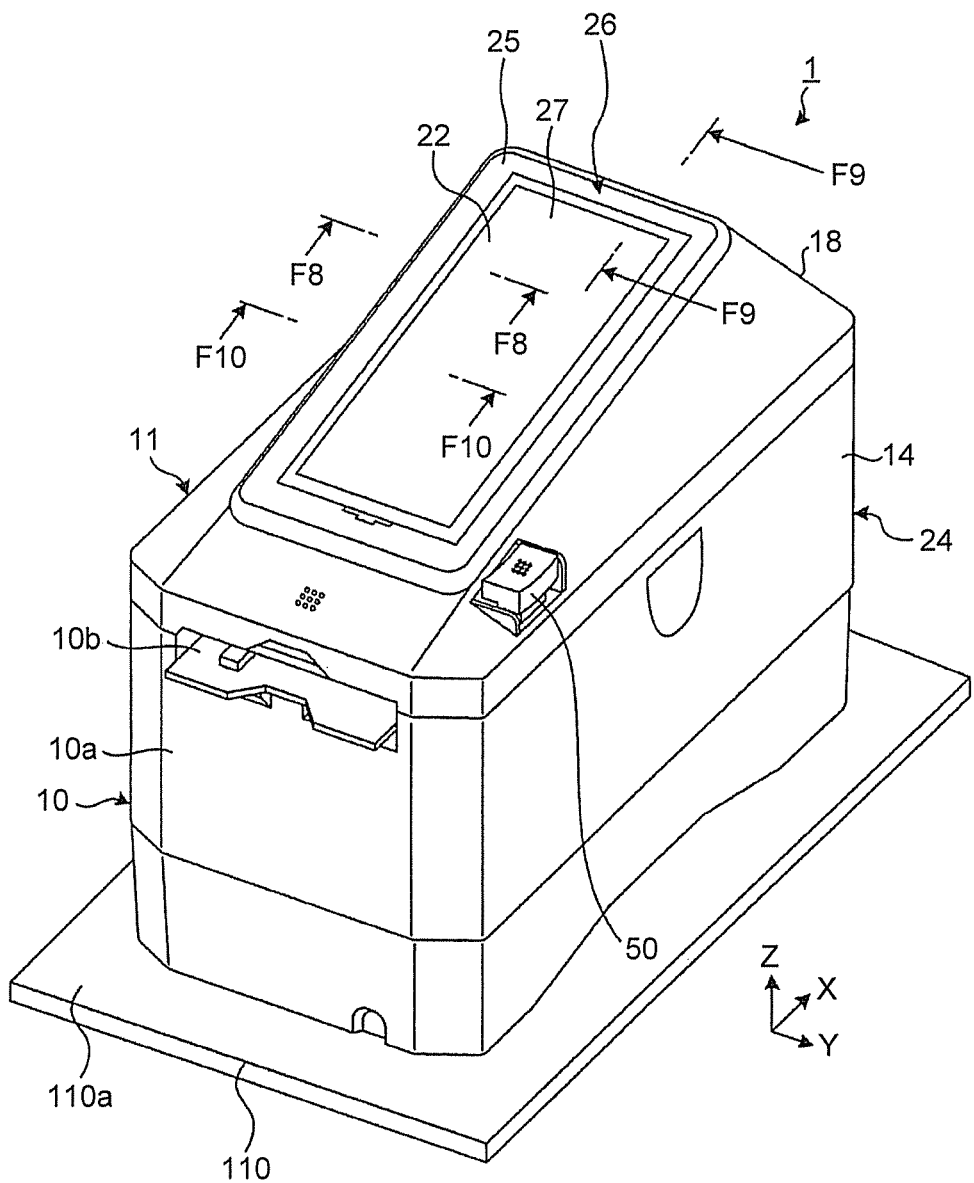
FIG. 1 is a perspective view showing a printer, as an electronic equipment, a cover of which is closed according to an embodiment.

An electronic equipment of the embodiment comprises a housing that has an attaching wall with an inclined surface on which a covered object is arranged, an attaching body that has a covering surface covering the covered object and is amounted on the attaching wall, a first convex portion, arranged on the inclined surface, that extends from a part located above the covered object in an inclined direction of the inclined surface toward a direction descending the inclined surface through the both sides of the covered object and projects toward the covering surface, wherein the projection tip portion of the first convex portion contacts the covering surface, and a second convex portion, arranged on the covering surface at the outside of the first convex portion, that extends from a part located above the covered object in the inclined direction of the inclined surface toward the direction descending the inclined surface through the both sides of the covered object and projects toward the inclined surface, wherein the projection tip portion of the second convex portion contacts the inclined surface.

Hereinafter, an embodiment will be described in detail with reference to the accompanying drawings. In the following embodiment, a printer, as an electronic equipment, that pulls out a paper wound in a rolled shape and prints on the paper is described. Further, in the drawings, for convenience, a backward direction in a front-back direction of a printer 1 is designated as an X direction, a width direction of the printer 1 is designated as a Y direction, and the height direction of the printer 1 is designated as a Z direction. These X direction, Y direction, and Z direction are orthogonally crossed with each other.

As shown in FIG. 1, the printer 1 has a base 10, and a cover 11. The printer 1 uses a battery (not shown) arranged at the base 10 as a power supply to operate. The printer 1, as one example, is placed on a plane surface 110a as a placing surface (upper surface) arranged on an installation section 110.

Figure 2:
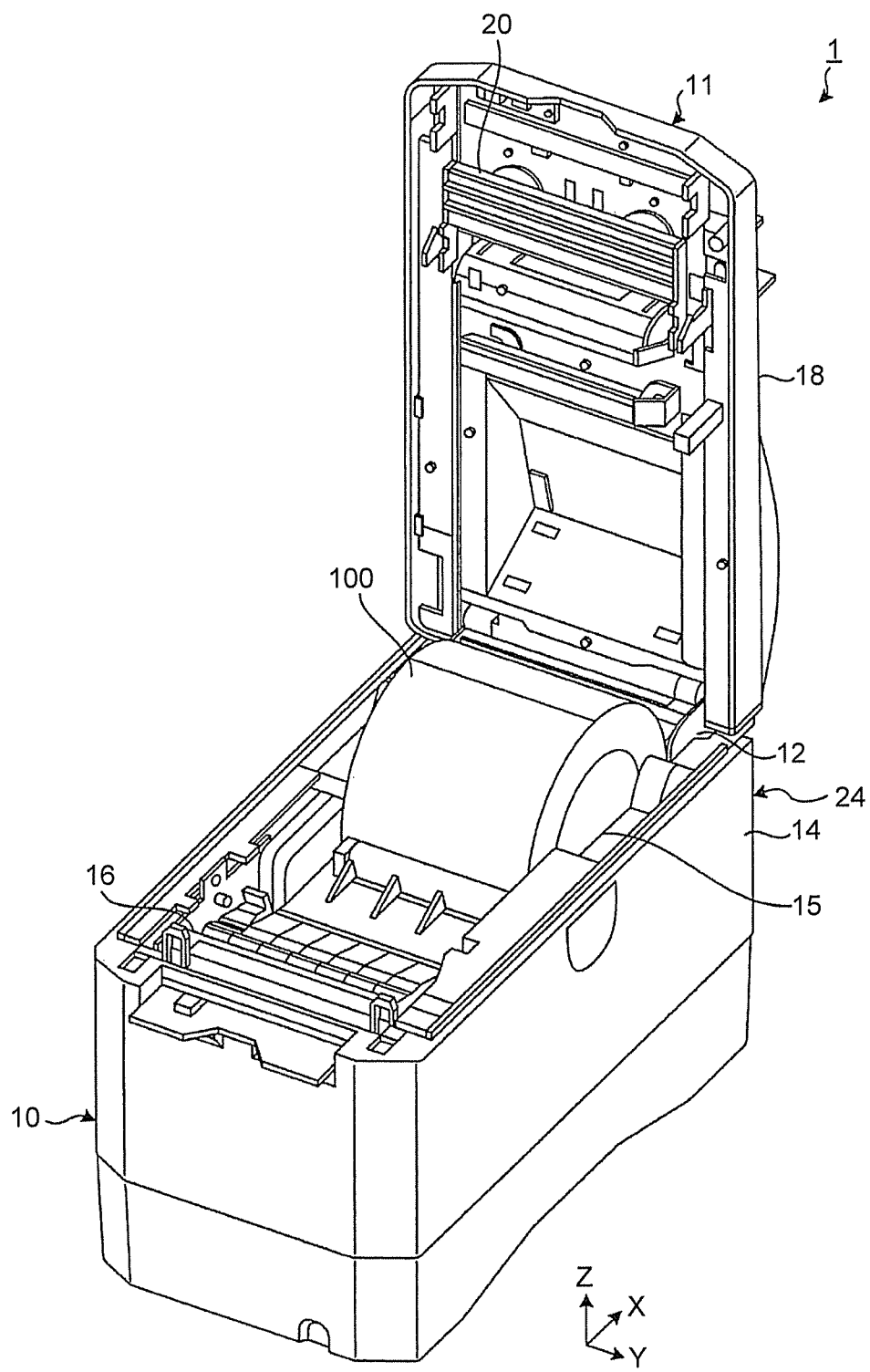
FIG. 2 is a perspective view showing the printer the cover of which is opened according to the embodiment.
Figure 3:
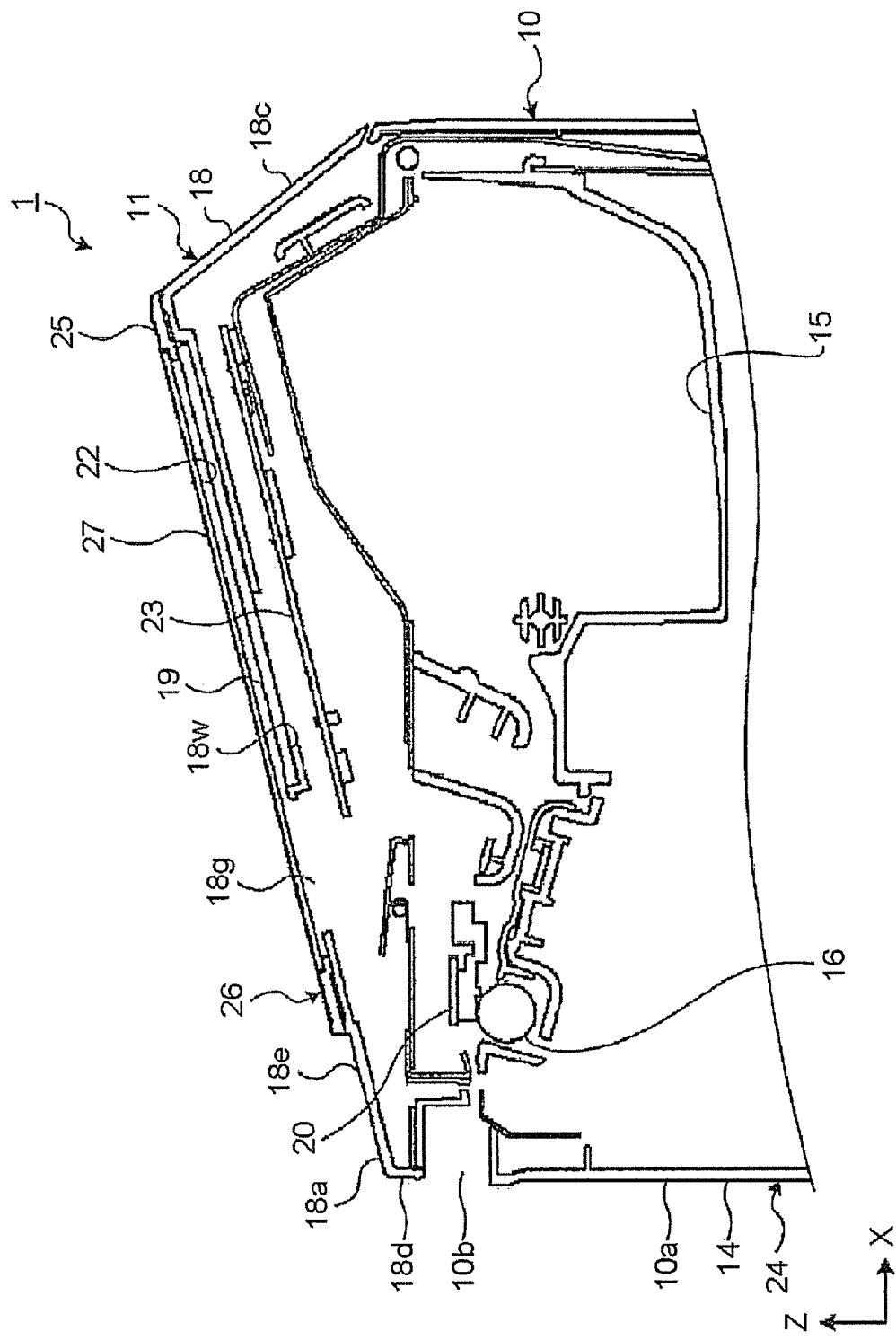
FIG. 3 is a longitudinal sectional side view showing the printer the cover of which is closed according to the embodiment.

As shown in FIGS. 1 to 3, the base 10 is roughly formed in a rectangular shape with an open upper surface thereof. The base 10 is formed such that the length of a front-back direction is larger than that of a left-right width direction. The base 10 supports the stored paper 100 (refer to FIG. 2). On the other hand, the cover 11 is roughly formed in a triangular shape, that is observed from the side thereof as shown in FIG. 1. The cover 11 is rotatably connected to the base 10 via a hinge 12 (refer to FIG. 2). In detail, the cover 11 is arranged at the upper part of the base 10 such that it is rotatably connected to the base 10 between a closed position where the upper part of the base 10 is covered (refer to FIGS. 1 and 3) and an open position where the upper part of the base 10 is exposed (refer to FIG. 2). A switch lock unit 50 is arranged in the printer 1, and the switch lock unit 50 locks the cover 11 located at the closed position to the base 10. A paper discharge port 10b is provided between the base 10 and the cover 11 at the front side 10a of the printer 10 to discharge the paper 100.

As shown in FIG. 2, the paper 100 used in the printer 1 is a lengthwise paper that is wound in a rolled shape. The paper 100 is for example a label paper or a receipt paper etc. In addition, the paper 100 may be provided with perforations (not shown) along the width direction thereof to be cut along the perforations. The printer 1, as an example, can issue a thicket using the paper 100 with the perforations. The paper 100 is stored in the base 10.

As shown in FIGS. 2 and 3, the base 10 has a first housing 14. A paper storage unit 15, a platen roller 16, a battery (not shown), a circuit substrate (not shown) etc. are arranged in the first housing 14. On the other hand, the cover 11 has a second housing 18. A display 19, a touch panel 22, a circuit substrate 23 (refer to FIG. 3), a print head 20 etc. are arranged in the second housing 18. In a state that the cover 11 is located at the closed position, the print head 20 forcibly contacts the platen roller 16. In a state that the cover 11 is located at the open position, the print head 20 is released from the platen roller 16. The first housing 14 and the second housing 18 constitute the housing 24 of the printer 1. The display 19, the touch panel 22, the circuit substrate 23 (refer to FIG. 3), and the print head 20 etc. each are one example of the electronic components, and they operate with the electric power from the battery.

Next, each part or section arranged in the base 10 will be described. As shown in FIGS. 2 and 3, the paper storage unit 15 is arranged at the rear part of the first housing 14. The paper storage unit 15 is formed in a concaved shape towards the downward direction with the upper part opened. The paper storage unit 15 supports the circumference of the lower part of the rolled paper 100 put into the paper storage unit 100 through the opening of the upper part. The paper storage unit 15 rotatably supports the paper 100, thereby the platen roller 16 can pull out the paper 100 while the platen roller 16 rotates.

The platen roller 16 is connected to a motor as a driving source via a power transmission mechanism formed with gears etc. The platen roller 16 pulls out the paper 100 stored in the paper storage unit 15 and conveys the paper 100 while the platen roller 16 is rotated by the motor in a state that the paper 100 is pressed by the print head 20 to the platen roller 16. The platen roller 16 is one example of a delivery unit that pulls out and conveys the paper 100 stored in the paper storage unit 15.

Next, each part or unit arranged in the cover 11 will be described. The print head 20 is for example a thermal head. The print head 20 is arranged opposite to the platen roller 16. The print head 20 is coupled to the inner surface of the cover 11 in a manner that it is detachable to the platen roller 16. The print head 20 is biased toward the platen roller 16 by a coil spring acting as a biasing member. The print head 20 biased by the coil spring presses the paper 100 laying between such print head 20 and the platen roller 16 against the platen roller 16. In this way, the conveying force of the platen roller 16 is reliably transmitted to the paper 100. The print head 20 has a plurality of heating elements arranged in line, and the heating elements generate heat by selectively energizing these heating elements according to the print data. Thus, the print head 20 prints various information on the paper 100 with the heat generated by the heating elements while the print head 20 is supported by the platen roller 16. The print head 20 is an example of the print unit.

The display 19, as one example, is a liquid crystal display. The display 19 is substantially formed in a rectangular plate shape. As shown in FIG. 3, a touch panel 22 is arranged above the display 19. The touch panel 22 is nearly formed in a rectangular shape. The touch panel 22 covers the display screen of the display 19. In addition, a circuit substrate 23 is arranged below the display 19. That is to say, the display 19 is arranged below the touch panel 22, and the circuit substrate 23 is arranged below the display 19. The display 19 and the touch panel 22 are electrically connected to the circuit substrate 23 with a harness (not shown).

Figure 4:
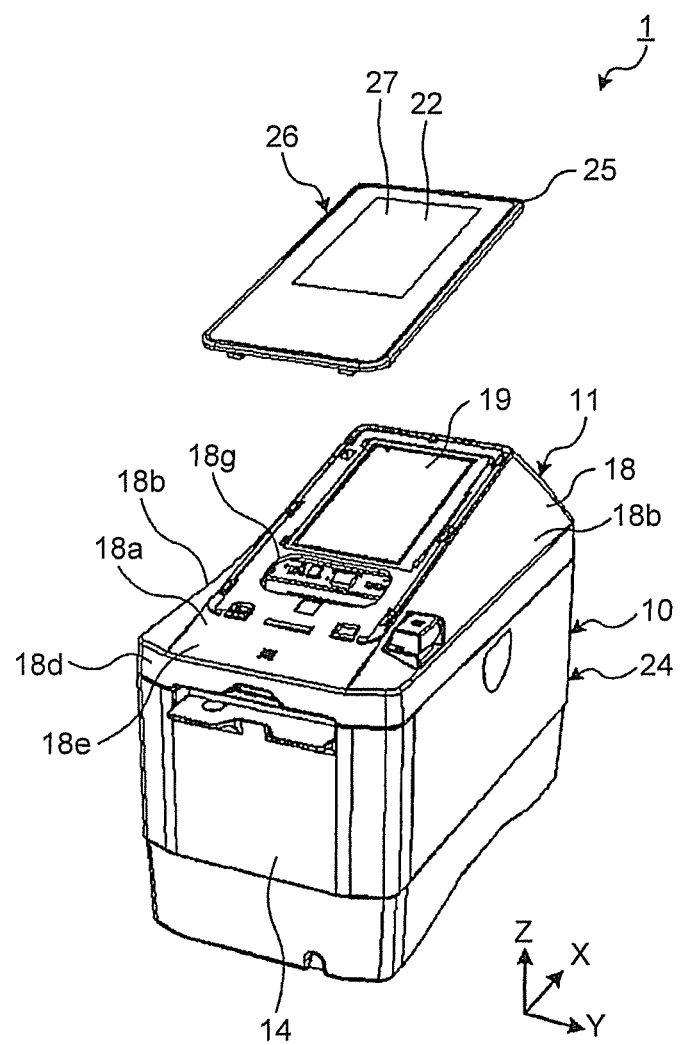
FIG. 4 is an exploded perspective view showing the printer according to the embodiment.

As shown is FIG. 4, the display 19 is fixed in the second housing 18. On the other hand, the touch panel 22 is fixed on a retaining member 25. A protective sheet 27 is arranged on the operation surface (upper surface) of the touch panel 22. The retaining member 25 constitutes an attaching body 26 along with the touch panel 22 and the protective sheet 27. The attaching body 26 is detachable to the second housing 18.

The second housing 18 has an attaching wall 18a as an upper wall, a pair of right and left side walls 18b, a backside wall 18c (refer to FIG. 3), and a circumferential wall 18d. The attaching wall 18a inclines with respect to a horizontal plane 110a. The display 19 and the touch panel 22 are mounted on the attaching wall 18a. The pair of side walls 18b downwardly extends from a pair of right and left side edges of the attaching wall 18a in an oblique sideward direction. That is, the pair of side walls 18b inclines with respect to the horizontal surface 110a. The backside wall 18c downwardly extends from the rear end (upper end) of the attaching wall 18a in an oblique backward direction. That is, the backside wall 18c inclines with respect to the horizontal surface 110a. The circumferential wall 18d extends downward from the attaching wall (upper wall, base wall) 18a and the lower ends of the pair of side walls 18b.

Figure 5:
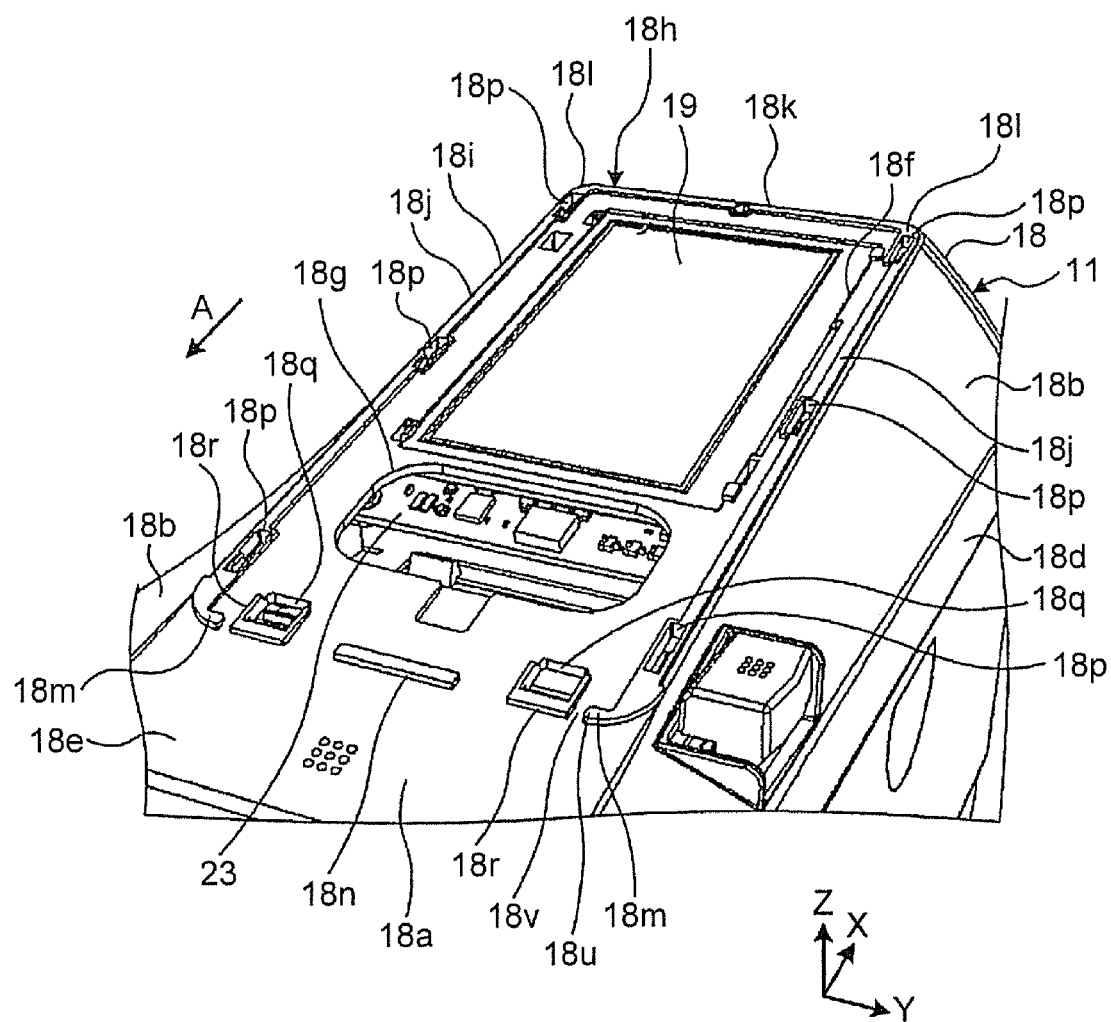
FIG. 5 is a perspective view showing a part of the printer according to the embodiment.

As shown in FIG. 5, an inclined surface 18e is arranged in the attaching wall 18a. The inclined surface 18e constitutes the surface of the attaching wall 18a. That is to say, the inclined surface 18e is arranged on the surface of the attaching wall 18a. The inclined surface 18e inclines with respect to the horizontal surface 110a.

Figure 8:
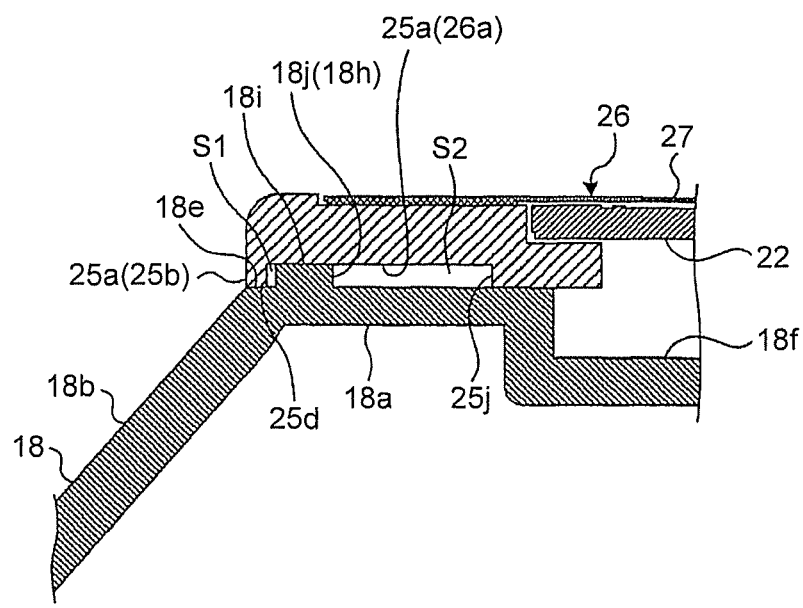
FIG. 8 is a sectional view taken on line F8-F8 in FIG. 1.
Figure 9:
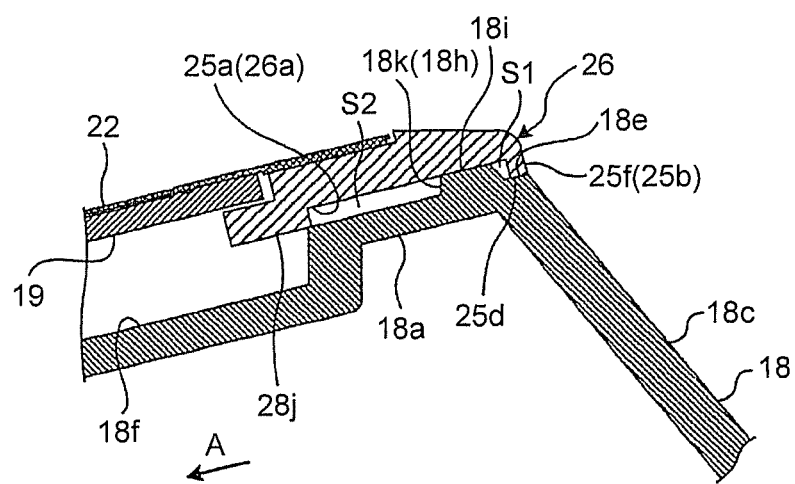
FIG. 9 is a sectional view taken on line F9-F9 in FIG. 1.
Figure 10:
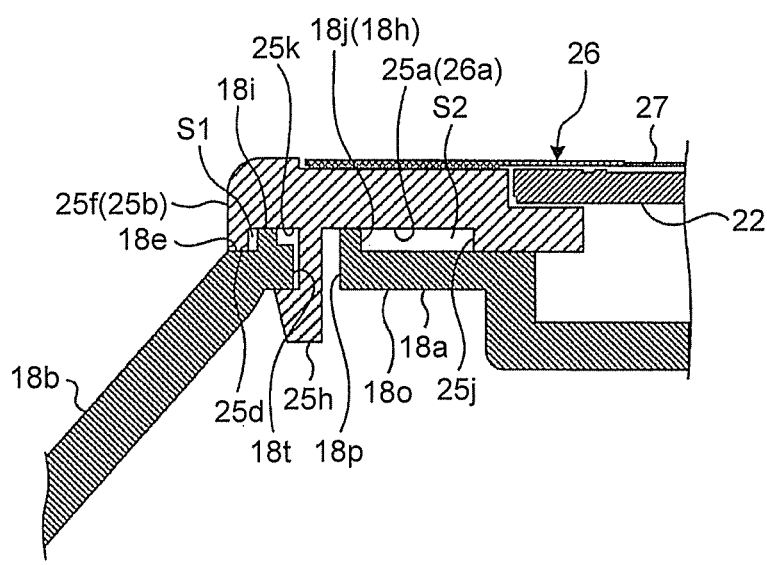
FIG. 10 is a sectional view taken on line F10-F10 in FIG. 1.

A concave portion 18f as an opening (referring to FIGS. 8 to 10) is arranged on the inclined surface 18e. A hole 18w (opening) is arranged at the bottom of the concave portion 18f. The display 19 is housed in the concave 18f. In FIGS. 8 to 10, the display 19 is omitted. In addition, a hole 18g as an opening is arranged at the lower portion of the concave portion 18f in an inclined direction of the inclined surface 18e. The hole 18g penetrates the attaching wall 18a. The harness (not shown) connecting the touch panel 22 with the circuit substrate 23 is inserted into the hole 18g. The concave portion (opening) 18f, the hole 18g and the display (electronic component) 19 each are one example of the covered object. Further, the covered object may be at least one of the electronic component and the opening.

Figure 7:
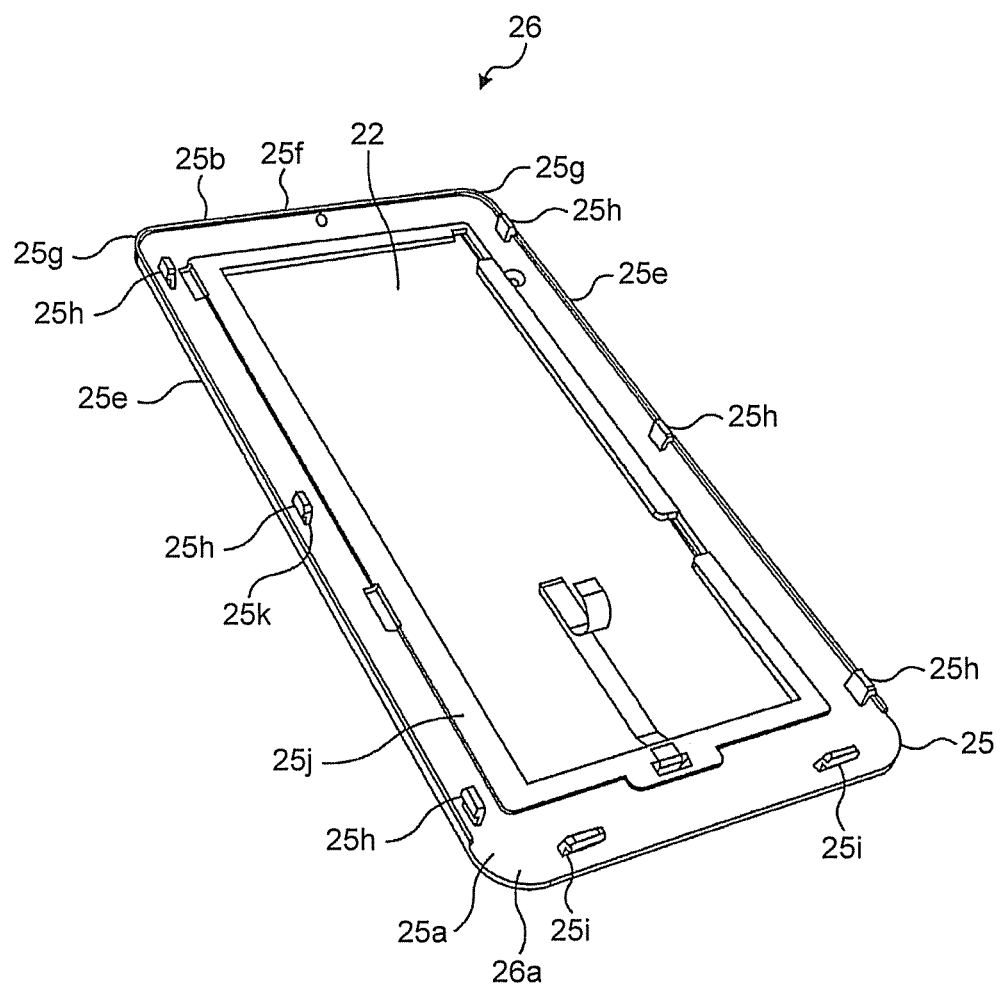
FIG. 7 is a perspective view showing an attaching body which is observed from the backside thereof according to the embodiment.

As shown in FIGS. 4 and 7, the attaching body 26 is substantially formed in a plate shape. As shown in FIG. 7, the attaching body 26 has a covering surface (backside surface) 26a. The covering surface 26a covers the concave portion 18f, the hole 18g and the display 19. The covering surface 26a constitutes the backside surface of the attaching body 26. The attaching body 26 is detachably mounted on the attaching wall 18a.

As shown in FIGS. 4 and 7, the retaining member 25 of the attaching body 26 is substantially formed in a rectangular frame shape, and retains the touch panel 22 arranged in its frame. As shown in FIG. 7, the backside surface 25a of the retaining member 25 constitutes the covering surface 26a to cover the inclined surface 18e. In the present embodiment, the backside surface 25a covers a part of the inclined surface 18e.

Next, an installation construction of the attaching wall 18a onto the attaching body 26 will be described.

As shown in FIG. 5, a convex portion 18h is arranged on the inclined surface 18e. The convex portion 18h is one example of the first convex portion. The convex portion 18h is provided on the inclined surface 18e such that it projects toward the covering surface 26a. The projecting edge portion (the tip in the projecting direction) 18i of the convex portion 18h contacts the backside surface 25a that forms the covering surface 26a (referring to FIGS. 8, 9, and 10). The convex portion 18h extends downwardly from the part located above the covered or protected object (the concave portion 18f, the hole 18g and the display 19) in the inclined direction of the inclined surface 18e ("A" direction in the figure) toward the direction descending along the inclined surface 18e via both sides of the covered object.

The convex portion 18h has a side peripheral portions of right and left pair 18j as well as an upper peripheral portion 18k, and they are arranged along the edge portion of the inclined surface 18e. The side peripheral portions 18j are one example of the first side peripheral portion, and the upper peripheral portion 18k is one example of the first upper peripheral portion. The upper peripheral portion 18k is one example of the part that is located above the covered object (the concave 18f, the hole 18g and the display 19) in the inclined direction of the inclined surface 18e of the convex portion 18h. The concave 18f, the touch panel 22 and the hole 18g are located at a region of the inclined surface 18e of the inside of the convex portion 18h.

The respective upper ends 18i of the pair of side peripheral portions 18j extending along the inclined direction of the inclined surface 18e ("A" direction in the drawing) are connected with each other by the upper peripheral portion 18k. The side peripheral portion 18j is arranged along the pair of side edges of the inclined surface 18e. The pair of side peripheral portions 18*j* are arranged such that a gap is kept between the side peripheral portions in a right and left direction. The upper peripheral portion 18*k* is arranged along the upper edge of the inclined surface 18*e*.

In addition, the extending portion 18*m* is arranged at the lower end of the side peripheral portion 18*j*. A pair of extending portions 18*m* are bent in a direction that the respective extending portions approach each other. The extending portions of right and left pair 18*m* are arranged such that a gap is kept between the extending portions, thereby an opening 18*v* is arranged at a lower end 18*u* of the convex portion 18*h*. In addition, within the inclined surface 18*e*, a convex portion 18*n* extending in a left-right direction is arranged between the extending portions of right and left pair 18*m*. The convex portion 18*n* is arranged on the inclined surface 18*e* such that a gap is kept between the convex portion 18*n* and the extending portions of the right and left pair 18*m*. In other words, the convex portion 18*n* projects into an opening 18*v*.

Figure 6:
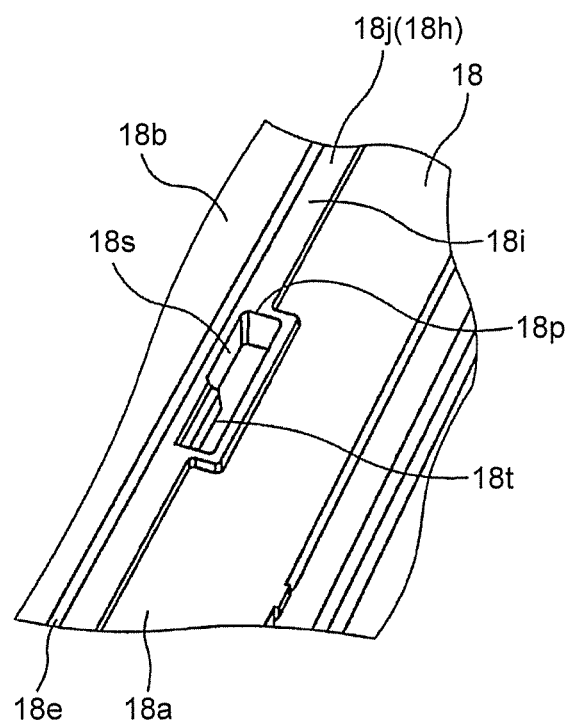
FIG. 6 is a perspective view showing a part of a second housing where an insert hole is arranged according to the embodiment.

In addition, a through-hole 18*p* is arranged in the attaching wall 18*a*, as shown in FIG. 5. The through-hole 18*p* penetrates the convex portion 18*h* and a backside surface 18*o* of such attaching wall 18*a* (referring to FIG. 10). A plurality of the through-holes 18*p* are arranged at regular intervals at each of the side peripheral portions 18*j* of the convex portion 18*h* in the inclined direction of the inclined surface 18*e*. The through-hole 18*p* is surrounded by a side peripheral portion 26*e* of the convex portion 18*h*. A claw portion 25*h* of the attaching body 26 is inserted into the through-hole 18*p* (referring to FIG. 10). As shown in FIG. 6, an insertion portion 18*s* is arranged in the through-hole 18*p*. The insertion portion 18*s* is arranged at the upper part of the through-hole 18*p* in the inclined direction of the inclined surface 18*e*. The insertion portion 18*s* enables the insertion of a claw portion 25*h* in the thickness direction of the attaching wall 18*a*. In addition, an engagement portion 18*t* is arranged on the surface of the through-hole 18*s* such that it projects into the through-hole 18*s*. The engagement portion 18*t* is located below the insertion portion 18*s* in the inclined direction of the inclined surface 18*e*. The claw portion 25*h* engages with the backside surface 18*o* of the engagement portion 18*t*.

As shown in FIG. 5, a through-hole 18*q* is arranged between the extending portions of right and left pair 18*m* and the convex portion 18*n* in the attaching wall 18*a*. The through-hole 18*q* penetrates the inclined surface 18*e* and the backside surface 18*o*. The through-hole 18*q* is one example of the through-hole. A claw 25*i* of the attaching body 26 (referring to FIG. 7) is inserted into the through-hole 18*q*.

A convex portion 18*r* is arranged at the hole edge of the through-hole 18*q* at the side of the inclined surface 18*e*. The convex portion 18*r* projects from the edge of the through-hole 18*q* at the side of the inclined surface 18*e* toward the backside surface 25*a* (covering surface 26*a*) of the retaining member 25. The convex portion 18*r* is arranged at the lower edge portion and side edge portion within the hole edge of the through-hole 18*q*. The convex portion 18*r* is one example of the third convex portion.

As shown in FIG. 7, a convex portion 25*b* is arranged at the backside surface 25*a* (covering surface 26*a*) of the retaining member 25 of the attaching body 26. The convex portion 25*b* is one example of the second convex portion. The convex portion 25*b* is arranged at the backside surface 25*a* (covering surface 26*a*) such that it projects toward the inclined surface 18*e*. A projection tip portion 25*d* of the convex portion 25*b* contacts the inclined surface 18*e*. And it is positioned at the outside of the convex portion 18*h*. The convex portion 25*b* extends from the part located above the covered object (concave 18*f*, hole 18*g* and display 19) in the inclined direction of the inclined surface 18*e* toward the direction descending along the inclined surface 18*e* through the two sides of the covered object. In this way, in the present embodiment, the convex portion is arranged double.

The convex portion 25*b* has side peripheral portions of right and left pair 25*e* and an upper peripheral portion 25*f*. The side peripheral portion 25*e* is one example of the second side peripheral portion and the upper peripheral portion 25*f* is one example of the second upper peripheral portion. The upper peripheral portion 25*f* is one example of the part located above the covered objects (the concave 18*f*, the hole 18*g* and the display 19) in the inclined direction of the inclined surface 18*e* within the convex portion 25*b*. The convex portion 25*b* is arranged at the outer circumference edge of the backside surface 25*a*. The convex portion 18*h* arranged on the inclined surface 18*e* is located at the inside of this convex portion 25*b*. The convex portion 25*b* and the convex portion 18*h* are separated from one to another.

The side peripheral portion 25*e* is arranged along a pair of side edge portions of the backside surface 25*a*. A pair of side peripheral portions 25*e* extends along the inclined direction of the inclined surface 18*e*. The pair of side peripheral portions 25*e* is arranged such that a gap is kept between the side peripheral portions in a left-right direction. The respective upper ends 25*g* of the pair of side peripheral portions 25*e* are connected with each other by an upper peripheral portion 25*f*. The upper peripheral portion 25*f* is arranged along the upper edge of the backside surface 25*a*.

A convex portion 25*j* is arranged at the inside of the convex portion 25*b* on the backside of the retaining member 25. The convex portion 25*j* is formed in a rectangular frame shape. The convex portion 25*j* is positioned apart from the convex portion 25*b*, and the convex portion 18*h* is located between the convex portion 25*j* and the convex portion 25*b*. The tip of the convex portion 25*j* contacts the inclined surface 18*e*.

In addition, a plurality of claw portions 25*h* projects from the backside surface 25*a*. The claw portion 25*h* is located at the inside of the convex portion 25*b*. The plurality of claw portions 25*h* are arranged along the side peripheral portion 25*e*. The claw portion 25*h* is inserted into the through-hole 18*p* arranged in the attaching wall 18*a*, and engages with the attaching wall 18*a* (refer to FIG. 10). In more detail, the claw portions 25*h* engage with the backside surface 18*o* of the engagement portion 18*t* arranged at the hole surface of the through-hole 18*p* within the attaching wall 18*a*. In a state that the claw portion 25*h* is inserted into the insertion portion 18*s*, the claw portion 25*h* is moved downward the inclined direction of the inclined surface 18*e*, thereby engaging with the backside surface 18*o* of the engagement portion 18*t*. From this state, the claw portion 25*h* is moved upward in the inclined direction of the inclined surface 18*e*, thereby detaching from the backside surface 18*o* of the engagement portion 18*t*. After that, the claw portion 25*h* is further moved to the insertion portion 18*s*.

As shown in FIG. 7, a plurality of claw portions 25*i* are arranged such that it project from the lower part of the backside surface 25*a*. Each of the plurality of claw portions 25*i* is positioned at regular intervals each other in the left-right direction. The claw portion 25*i* can be inserted into a through-hole 18*q* arranged in the attaching wall 18*a*. The claw portion 25*i* is inserted into the through-hole 18*q* arranged in the attaching wall 18*a*, and engages with the attaching wall 18*a*. In more detail, the claw portion 25*i* engages with the hole edge of the front end of the through-hole 18*q* within the backside surface 18*o* of the attaching wall 18*a*. In a state that the claw portion 25*i* is inserted into the through-hole 18*q*, the claw portion 25*i* is moved downward in the inclined direction of the inclined surface 18e, thereby engaging with the backside surface 18o. From this state, the claw portion 25i is moved upward in the inclined direction of the inclined surface 18e, thereby detaching from the surface 18o.

In the above-mentioned construction, when the attaching body 26 is mounted on the attaching wall 18a, in a state of the claw portions 25h, 25i being inserted into the through-holes 18p, 18q, the attaching body 26 slides forward (downward) along the inclined surface 18e in a state that the claw portions 25h and 25i are respectively inserted the through-holes 18p and 18q, whereby the claw portions 25h and 25i engage with the backside surface 18o of the attaching wall 18a. In this way, the attaching body 26 can be mounted on the attaching wall 18a. On the other hand, when the attaching body 26 is disengaged from the attaching wall 18a, the attaching body 26 slides backward along the inclined surface 18e, whereby the claw portions 25h and 25i are detached from the backside surface 18o of the attaching wall 18a.

As shown in FIGS. 8, 9 and 10, in a state that the attaching body 26 is amounted on the attaching wall 18a, the projection tip portion 25d of the convex portion 25b of the attaching body 26 contacts the inclined surface 18e, and projection tip portion 18i of the convex portion 18h of the attaching wall 18a contacts the backside surface 25a (covering surface 26a) in the retaining member 25 of the attaching body 26. At this time, in a part where the convex portion 25b and convex portion 18h are opposite to each other, the projection tip portion 18i of the convex portion 18h is located higher than the projection tip portion 25d of the convex portion 25b. In addition, a space S1 is formed between the convex portion 25b and the convex portion 18h. A space S2 is also formed between the convex portion 18h and the convex portion 25j. In the present embodiment, the space S1 and S2 are located at approximately the same height as the convex portion 18h. Further, the height of the position of the spaces S1 and S2 may be higher than that of the convex portion 18n by forming a concave portion which extends upward toward the ceiling part of the spaces S1 and S2 within the retaining member 25. In addition, a space is kept between a base 25k of the claw portion 25h and the convex portion 18h (refer to FIG. 10).

In the printer 1 having the above-mentioned construction, if liquid such as water is poured from the above, such liquid flows on the surface of the inclined attaching body 26 along the inclined surface 18e, and flows from the attaching body 26 to a part which is not covered by the attaching body 26 within the inclined surface 18e, for example. In this way, such liquid that is poured can be prevented from splashing onto the display 19 or from intruding into the housing 24 through the hole 18g.

In a case in which liquid is splashed to a boundary part between the attaching body 26 and the housing 24 at the outer surface of the printer 1, such liquid intrudes into a minute gap formed between the inclined surface 18e and a tip (edge surface) 25d of the convex portion 25b of the attaching body 26 due to capillary action, for example. The minute gap between the inclined surface 18e and projection tip portion 25d of the convex portion 25b is formed by a minute concavo-convex formed between the inclined surface 18e and the projection tip portion 25d of the convex portion 25b due to each surface roughness. A part of the liquid, as an example, permeating into the minute gap formed between the inclined surface 18e and the projection tip portion 25d of the convex portion 25b of the attaching body 26, moves downward (forward) along the convex portion 25b by gravity, and is discharged from the lower end of the convex portion 25d, for example.

In addition, as an example, a part of the liquid intruding into the minute gap formed between the inclined surface 18e and the projection tip portion 25d of the convex portion 25b of the attaching body 26 is discharged to the space S1, for example. A part of the liquid, as an example, discharged to the space S1 moves downward (forward) within the space S1 due to gravity, and is discharged from the lower end of the space S1, for example.

As an example, a part of the liquid discharged to the space S1, for example, intrudes into the minute gap formed between the projection tip portion (edge surface) 18i of the convex portion 18h of the attaching wall 18a and the backside surface 25a of the retaining member 25 due to the capillary action. The minute gap between the projection tip portion 18i of the convex portion 18h and the backside surface 25a, as one example, is formed by the minute concavo-convex between the projection tip portion 18i of the convex portion 18h and the backside surface 25a. The liquid intruding into the minute gap between the projection tip portion 18i of the convex portion 18h and the backside surface 25a, as one example, moves downward (forward) along the convex portion 18h due to gravity, and is discharged from the lower end of the convex portion 18h. At this time, since the convex portion 18h locates apart from the base 25k of the claw portion 25h, thus it is restrained that the liquid moving along the convex portion 18h moves to the claw portion 25h, and such liquid intrudes into the through-hole 18p.

In addition, as one example, the liquid discharged to the opening 18v at the lower end of the convex portion 18h rises between the inclined surface 18e and the backside surface 25a of the retaining member 25 by a distance, and stays between the inclined surface 18e and the backside surface 25a of the retaining member 25 at a side of the through-hole 18q. Such liquid is discharged from the opening 18v due to gravity when the liquid stayed comes to a given amount. At this time, such liquid is prevented from intruding into the opening 18v by the convex portion 18r arranged at the edge of the opening 18v.

As stated above, in the present embodiment, if a liquid is poured onto the boundary of the attaching body 26 and the housing 24 on the outside surface of the printer 1, such liquid, as one example, moves downward (forward) along the convex portions 18h and 25b, and the space S1 t and then is discharged. Accordingly, the liquid can be prevented from intruding into the interior of the printer 1 (the housing 24).

According to the present embodiment, since an opening 18v is arranged at the lower end of the convex portion 18h, the liquid flowing on the convex portion 18h is discharged from the opening 18v, whereby the liquid can be prevented from intruding into the interior of the printer 1.

In addition, in the present embodiment, since a gap is kept between the base 25k of the claw portion 25h and the convex portion 18h, such liquid is prevented from intruding into the through-hole 18p, whereby the liquid can be prevented from intruding into the interior of the printer 1.

In addition, in the present embodiment, a convex portion 18r projecting from the edge of the through-hole 18q at a side of the inclined surface 18e toward the backside surface 25a is arranged in the inclined surface 18e. Accordingly, the liquid can be prevented from intruding from the through-hole 18q into the housing 24.

In the above-mentioned embodiment, the printer is described as an electronic equipment, by way of example, but the present invention is not limited to this. For example, the electronic equipment may be a reader/writer etc. that reads and writes information with respect to an information storage medium. In addition, the electronic equipment may also be a POS terminal that conducts a commodity registration and a checkout process relating to one transaction, or a card checkout processing terminal that can conduct a checkout process for a card payment.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. An electronic equipment, comprising:
    a housing that has an attaching wall with an inclined surface, wherein a covered object is unremovably arranged on the inclined surface;
    an attaching body that has a covering surface covering all of the covered object from above and is amounted on the attaching wall;
    a first convex portion, arranged on the inclined surface, that extends from a part located above the covered object in an inclined direction of the inclined surface toward a direction descending the inclined surface through the both sides of the covered object and projects toward the covering surface, wherein a projection tip portion of the first convex portion contacts the covering surface; and
    a second convex portion, arranged on the covering surface at the outside of the first convex portion, that extends from a part located above the covered object in the inclined direction of the inclined surface toward the direction descending the inclined surface through the both sides of the covered object, and projects toward the inclined surface, wherein a projection tip portion of the second convex portion contacts the inclined surface, wherein the attaching wall has a through-hole penetrating the first convex portion and a backside surface and the covering surface has a claw portion, projecting therefrom, that is inserted into the through-hole to engage with the attaching wall, and wherein the first convex portion surrounds the through-hole.

2. The electronic equipment according to claim 1, further including an opening that is arranged at the lower end of the first convex portion.

3. The electronic equipment according to claim 1, wherein the part of the first convex portion is a first upper peripheral portion and, the first convex portion has a pair of first side peripheral portions that extends along the inclined direction of the inclined surface and the respective upper ends thereof are connected by the first upper peripheral portion, and wherein the part of the second convex portion is a second upper peripheral portion, and the second convex portion has a pair of second side peripheral portions that extends along the inclined direction of the inclined surface and the respective upper ends thereof are connected by the second upper peripheral portion.

4. The electronic equipment according to claim 1, wherein the claw portion has a base positioned apart from the first convex portion.

5. The electronic equipment according to claim 1, wherein the covered object is at least one of an electronic component and opening.

* * * * *